(12) United States Patent
Pham et al.

(10) Patent No.: US 8,319,501 B2
(45) Date of Patent: Nov. 27, 2012

(54) OPTICAL COMPONENT IDENTIFIER

(75) Inventors: Larry Lam Pham, Portland, OR (US);
Paul Leonard Pankratz, Sandy, OR (US)

(73) Assignee: Xerox Corporation, Norwalk, CT (US)

( * ) Notice: Subject to any disclaimer, the term of this patent is extended or adjusted under 35 U.S.C. 154(b) by 410 days.

(21) Appl. No.: 12/489,351

(22) Filed: Jun. 22, 2009

(65) Prior Publication Data

US 2010/0321031 A1    Dec. 23, 2010

(51) Int. Cl.
*G01R 31/02* (2006.01)

(52) U.S. Cl. .............. 324/537; 324/750.15; 382/151

(58) Field of Classification Search .......... 324/537, 324/750.3, 754.23, 762.01, 501, 750.15; 340/815.45; 382/145–147, 151; 356/237.3–237.6
See application file for complete search history.

(56) References Cited

U.S. PATENT DOCUMENTS

| | | | | |
|---|---|---|---|---|
| 4,661,772 A * | 4/1987 | Kirstein | ................. | 324/537 |
| 4,755,874 A * | 7/1988 | Esrig et al. | ................. | 348/126 |
| 4,978,224 A * | 12/1990 | Kishimoto et al. | .......... | 356/394 |
| 6,246,788 B1 * | 6/2001 | Pattikonda et al. | ......... | 382/147 |
| 6,445,813 B1 * | 9/2002 | Ikurumi et al. | ............. | 382/147 |
| 6,611,265 B1 * | 8/2003 | Hong et al. | ............... | 345/426 |
| 6,650,130 B1 * | 11/2003 | Kash et al. | ............. | 324/762.03 |
| 6,798,527 B2 * | 9/2004 | Fukumoto et al. | .......... | 356/602 |
| 7,042,573 B2 * | 5/2006 | Froggatt | ................. | 356/479 |
| 7,391,005 B2 * | 6/2008 | Sherazi et al. | ........... | 250/214 R |
| 7,868,630 B2 * | 1/2011 | Caldwell et al. | ......... | 324/754.23 |

* cited by examiner

*Primary Examiner* — Arleen M Vazquez
(74) *Attorney, Agent, or Firm* — Marger Johnson & McCollom PC

(57) ABSTRACT

A circuit board including a plurality of components; a plurality of light sources aligned along at least one axis; and a controller configured to activate the light sources to identify at least one of the components. The components on the circuit board can be identified by the light sources in response to a variety of conditions.

13 Claims, 4 Drawing Sheets

OPTICAL COMPONENT IDENTIFIER

BACKGROUND

This disclosure relates to identification of components and, in particular to optical identification of components.

Circuit boards can have a vast number of components. A silk-screen layer on a circuit board can identify the components. For example, text of "R24" next to a resistor, pads for a resistor, or the like on the circuit board can identify that particular component, namely as resistor R24. However, with larger circuit boards, arrays of similar components, or the like, it can be difficult and/or time consuming to locate a particular component, even if the component has a printed designation on the circuit board.

DETAILED DESCRIPTION

Embodiments will be described in reference to the drawings. In particular, embodiments will be described where light is used by an optical component identifier to focus a user's attention towards a particular component or components.

Figure 1:
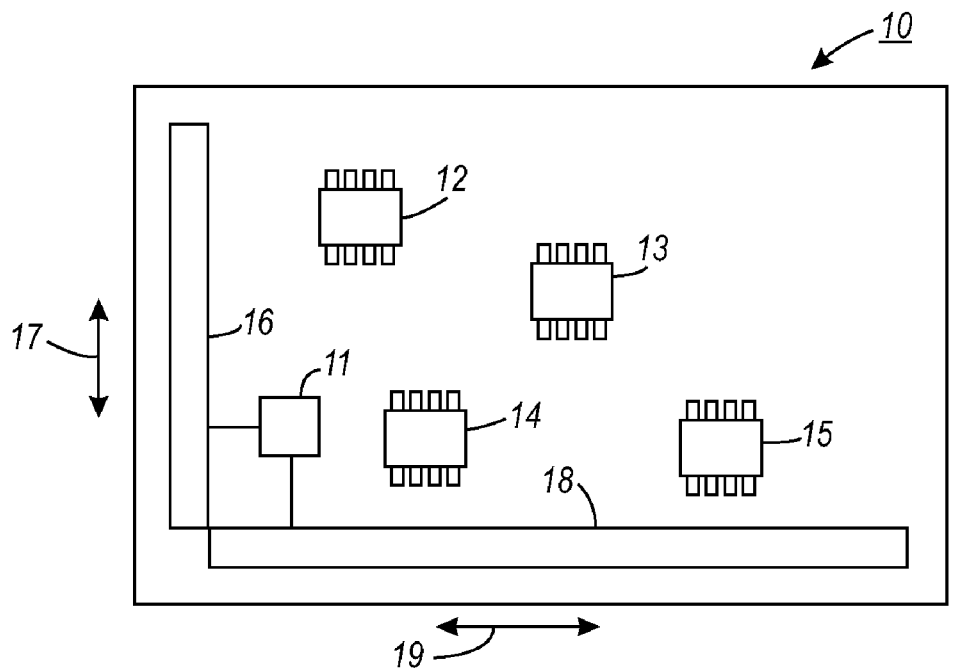
FIG. 1 is a block diagram of a circuit board with an optical component identifier according to an embodiment.

FIG. 1 is a block diagram of a circuit board with an optical component identifier according to an embodiment. The circuit board 10 includes a variety of components 12-15. The components 12-15 can be spaced across the circuit board 10. As used herein, a component can include any identifiable feature of the circuit board 10. For example, the components can include resistors, capacitors, integrated circuits, test points, pads, connectors, or the like. A component can also include other structures on the circuit board such as silk-screen references, solder mask openings, vias, through-holes, or the like. Furthermore, a component can include a location for such components. For example, a component can include a location for a resistor, regardless of whether that resistor is actually installed. In addition, a component can include a conceptual organization. For example, a component can include a circuitry forming a functional block such as processing circuitry, memory circuitry, user interfaces, or the like. Anything that is identifiable on the circuit board can be a component.

In addition to the various generic components 12-15 described above, the circuit board 10 includes a plurality of light sources. The light sources can be any variety of devices that can emit light. For example, the light source can include light emitting diodes (LED), lamps, light pipes, or the like. Any device that can emit light can be used as a light source.

In this embodiment, the light sources are disposed in arrays 16 and 18 are aligned along two axes 17 and 19, respectively. For example, the array 16 can be as series of LEDs aligned in an array of discrete elements. In another example, the array 16 can be an integrated array. Although two aces 17 and 19 have been described, one axis of light sources or greater than two axes can be used.

The circuit board 10 also includes a controller 11. The controller 11 is configured to activate the light sources to identify at least one of the components. Identifying a component using the light sources can include a variety of techniques. In this embodiment, the identification uses Cartesian coordinates. That is, in this example, the arrays 16 and 18 create two orthogonal axes of a Cartesian coordinate system relative to the circuit board 10.

Figure 2:
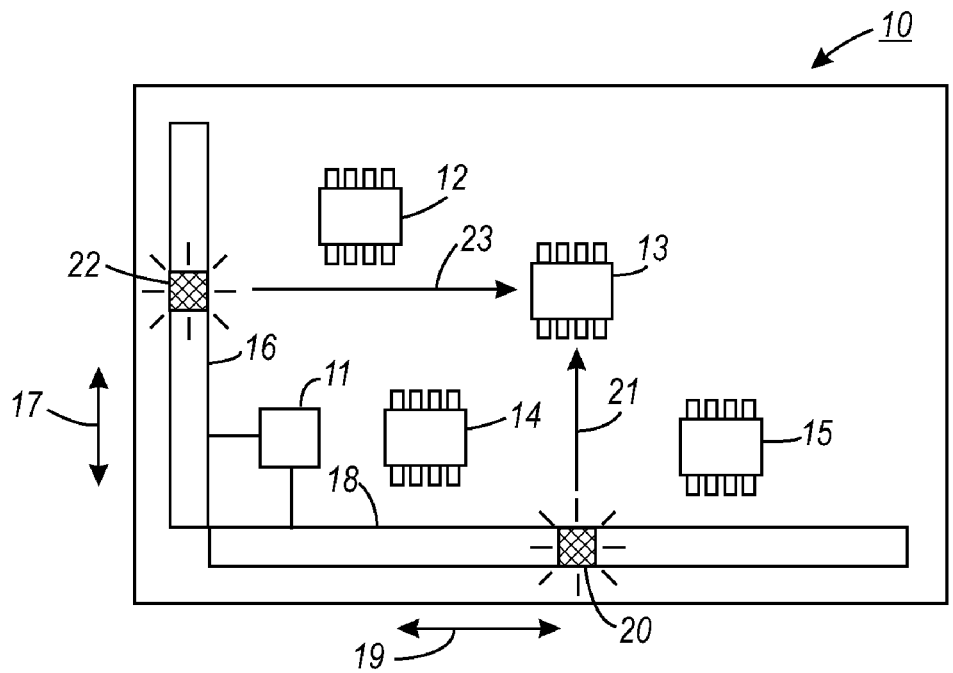
FIG. 2 is a block diagram of the circuit board of FIG. 1 illustrating an identified component.

FIG. 2 is a block diagram of the circuit board of FIG. 1 illustrating an identified component. Two light sources 20 and 22 of the arrays 16 and 18 are illuminated. In this embodiment, the location of the light source 20 and 22 along the arrays 16 and 18 correspond to the location of the component 13 on the circuit board 10. That is, the location of the light source 20 along array 18 corresponds to the location of the component 13 along axis 19. Similarly, the location of the light source 22 along array 16 corresponds to the location of the component 13 along axis 17. In an embodiment, the controller 11 can activate the light sources 20 and 22 to indicate the position of the component 13. That is, with the illumination of light sources 20 and 22, the user's attention is drawn in directions 21 and 23, intersecting on component 13. Similarly, components 12, 14 and 15 could be identified by activating corresponding light sources of the arrays 16 and 18.

The above example illustrates only one technique, namely, illuminating light sources along the arrays 16 and 18, as a way to identify a component. However, other techniques can be used. For example, the controller 11 could cause the light sources 20 and 22 to blink, illuminate particular colors, illuminate particular intensities, or the like. In another example, the controller 11 could cause light sources to sequentially illuminate light sources adjacent to the light sources 20 and 22, culminating in the illumination of the light sources 20 and 22. That is, the user's attention can be obtained by motion, then directed by the final state of the light sources 16 and 18. In another example, the light sources 16 and 18 can include two dimensional arrays, such as LED arrays. Accordingly, a line, arrow, or any other symbol could be used to focus the user's attention. In addition, a plurality of light sources can be activated. For example, a plurality of light sources along array 16 can correspond to a width of a component. Any combination of such techniques could be used.

The controller 11 can obtain the identification of the component of interest in a variety of ways. For example, the controller 11 can be configured to receive an indication of the component of interest. The controller 11 can be configured to receive a part designation of a component. The controller 11 can then cross-reference a netlist, layout files, or the like related to the circuit board 10 to obtain a location of the component. The controller 11 can then control the light sources 16 and 18 to illuminate to identify the component of interest. In another example, the controller 11 can receive a location associated with the component of interest. The controller 11 can then control the light source 16 and 18 to identify the location, and hence, the component of interest.

In another embodiment, the controller 11 can be configured to perform a test. For example, the controller 11 can perform a power-on startup test. In another example, the controller 11 can perform a diagnostic test. Accordingly, results of the test can be used to identify components of interest. The controller 11 can then control the light source 16 and 18 to identify the component of interest. For example, a component that has failed can be identified through the test. The failed component can then be identified.

In another example, the identified component can be a component pertinent to a test procedure. For example, during a test, a user may need to find a particular component in order to apply a test probe. The controller 11 can be configured to identify the location for the test probe, such as a test point, a device, a pad, or the like. The user can use the identification to plate the test probe. Accordingly, a variety of ways can be used to determine a component of interest. Once determined, that component of interest can be identified by controlling the arrays 16 and 18.

Figure 3:
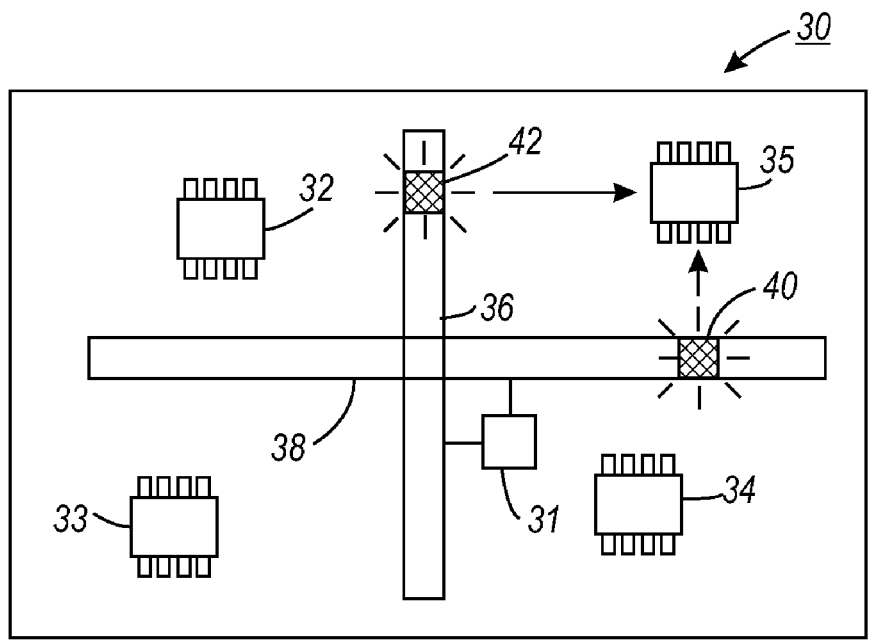
FIG. 3 is a block diagram of a circuit board with an optical component identifier according to another embodiment.

FIG. 3 is a block diagram of a circuit board with an optical component identifier according to another embodiment. As described above, the light sources were disposed in arrays 16 and 18 along edges of the circuit board 10. However, the light sources can be configured in a variety of configurations. In this embodiment, the light sources are disposed in arrays 36 and 38. Array 36 is disposed along one axis of the circuit board 30 while array 38 is disposed along a second axis. As the axes corresponding to the arrays 36 and 38 can be substantially orthogonal, the arrays 36 and 38 can divide the circuit board 30 into quadrants. As a result, light sources activated to identify a particular component can be disposed closer to the component than if the light source were disposed on an edge of the circuit board 30. A conceptual line projecting from a light source substantially orthogonal to an array, such as array 36, can be shorter, reducing a potential error in identification as a user's error in visual alignment can increase with increasing distance from the light sources.

Although light sources and the arrays have been described as being in the center, on the edges of a circuit board, the light sources and the corresponding arrays can be disposed in a variety of other locations and configurations. For example, an array of light sources such as array 38 can be used with an array 16 of FIG. 1, forming a T shape. In another example, the arrays need not be parallel to an edge of the circuit board 30. The arrays could be disposed at an angle relative to the sides of the circuit board 30. In another embodiment, the arrays need not be orthogonal. For example, the arrays can be at disposed with angles other than 90 degrees between the arrays. In another embodiment, the arrays need not be linear. For example, the arrays can follow curves, line segments, or the like. In another embodiment, the arrays need not be continuous. For example, the light sources can be spaced periodically along an axis with an amount of space between the individual light sources. In this embodiment, to identify a component that is between two light sources along one axis, the two light sources can be illuminated to correspond to the location. For example, the relative intensities of the two light sources can be we weighted according to the proximity along the axis of the component to the light sources. That is, if the component is closer to one light source, that light source can be illuminated with a higher intensity.

In other words, the light sources and arrays can be disposed as desired on the circuit board. For example, the light sources can be disposed on the circuit board according to the shape, complexity, distribution of components, or the like relative to the circuit board. In another example, different configurations can be used for differing sections of the circuit board. Regions including components arrayed with an aspect ratio substantially equal to one can be associated with light sources using two orthogonal arrays as described above. Regions including components arrayed with a higher or lower aspect ratio, can be associated with a single array of light source aligned along a single axis.

Figure 4:
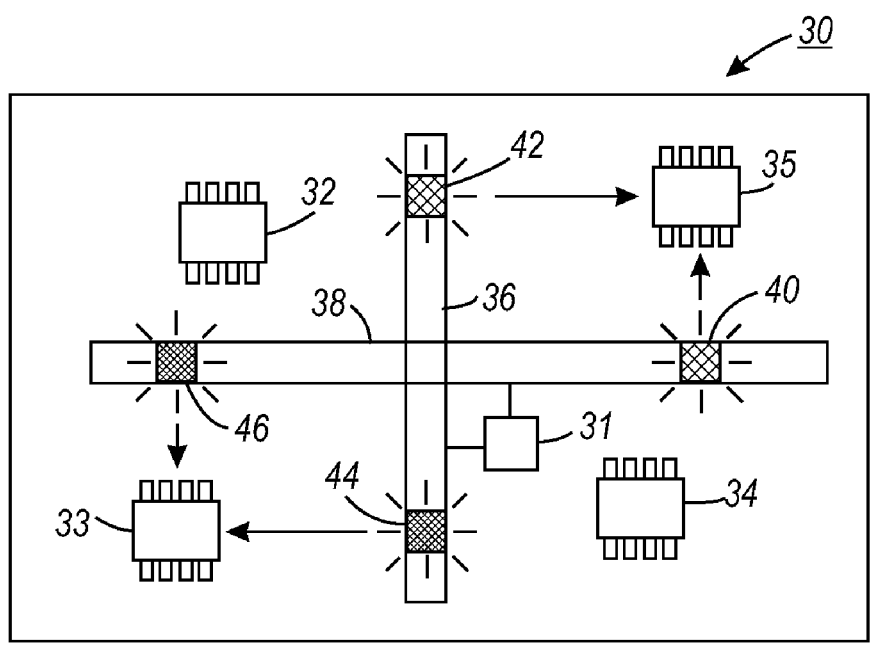
FIG. 4 is a block diagram of the circuit board of FIG. 3 illustrating multiple identified components.

FIG. 4 is a block diagram of the circuit board of FIG. 3 illustrating multiple identified components. As described above, a single component can be identified using the light sources. However, in an embodiment, multiple components can be identified substantially simultaneously.

The controller 31 is configured to activate the light source 40 and 42 to identify the component 35. The controller 31 can also be configured to activate the light sources 44 and 46 to identify component 33. As illustrated, the light sources 40 and 42 have a different shading from light sources 44 and 46. This different shading can represent a different pattern, color, intensity, or the like. Accordingly, the multiple different components can be distinguished by matching the similarly illuminated light sources.

In an embodiment, the light sources can be illuminated with similar features. For example, only the light sources corresponding to a single component of the components 33 and 35 could be illuminated at any one time. For example, light sources 40 and 42 can be activated while light sources 44 and 46 are deactivated at a first time. At a second time, light sources 40 and 42 can be deactivated and light sources 44 and 46 can be activated. Thus, the light sources could be illuminated with the same color, intensity, pattern, or the like; however, at substantially any one time, only the light sources corresponding to a single component are illuminated. This does not mean that the periods of illumination cannot overlap. However, there can be some difference such that the grouping of light sources 44 and 46 is distinguished from the grouping of light sources 40 and 42 that can be apparent to a user.

In another embodiment, a multi-color LED, multiple LEDs or the like can form a single light source. Thus, light sources activated for different components can have different colors. In another embodiment, a pulse width modulated (PWM) signal can be used to drive LEDs. Different PWM signals with different pulse widths, resulting in a duty cycle of 100%, 60%, 10%, or the like, can be used to drive LEDs identifying different components. Thus, the intensity of the LEDs for different components can appear different to a user.

Although a variety of examples have been described for activating light sources associated with a component to distinguish the component from other identified components, a single distinguishing scheme can, but need not be used. For example, a first component can be distinguished by activating the corresponding light sources with a green color. A second component can be distinguished by activating the corresponding light sources with a 50% duty cycle PWM signal. A third component can be distinguished by flashing the corresponding light sources with a particular pattern apparent to a user. Thus, multiple different components can be identified using different techniques to distinguish the associated light sources.

Figure 5:
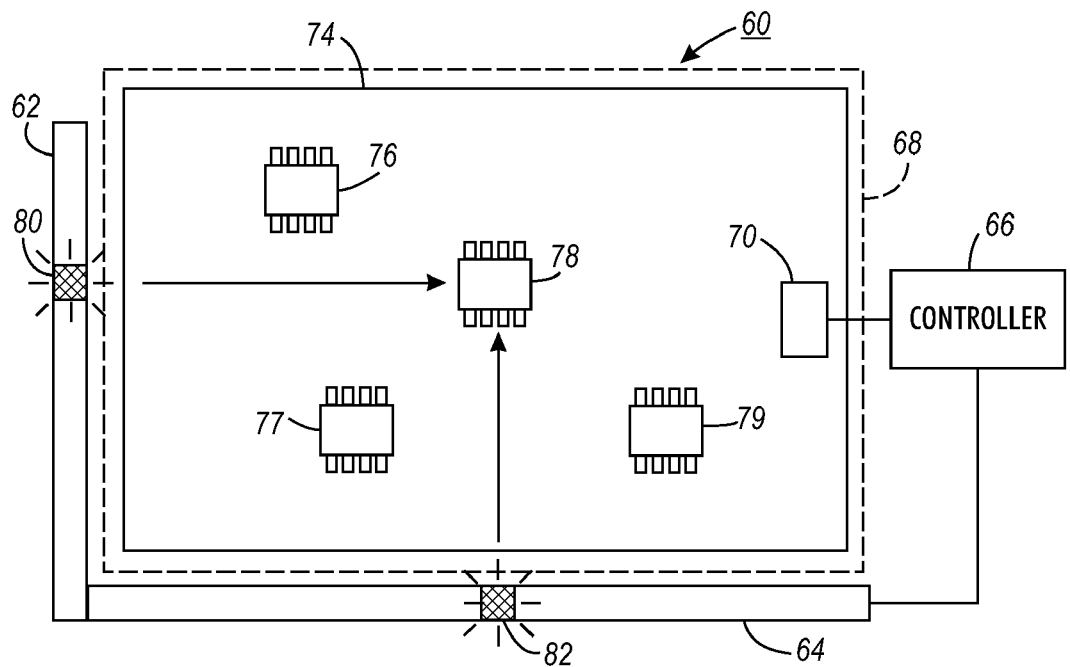
FIG. 5 is a block diagram of a test station with an optical component identifier according to an embodiment.

FIG. 5 is a block diagram of a test station with an optical component identifier according to an embodiment. In an embodiment described above, the circuit board itself includes the controller and light sources that can identify components. However, the use of an optical component identifier can be used to identify components that are not on such a circuit board.

In this embodiment, a test station 60 includes a light source, a test area 68 to receive a device under test 74 (DUT), and a controller 66. The controller 66 is coupled to the light source and configured to activate the light source to identify at least one part of the DUT 74.

In this embodiment, the light source includes light source arrays 62 and 64. The arrays 62 and 64 are coupled to a controller 66. The controller 66 is coupled to a device under test 74 (DUT) within a test area 68 through a connector 70 on the DUT. The arrays 62 and 64 are disposed on the perimeter of the test area 68. As illustrated, the arrays 62 and 64 can be disposed such that the arrays are substantially orthogonal. However, as described above, the light sources on a circuit board can be disposed in a variety of layouts. Similarly, light sources can be disposed around the test area 68 in a variety of configurations.

Accordingly, the DUT 74 can be placed in the test area 68 and coupled to the controller 66. Through a test procedure, similar to the test procedure described above, a component of interest on the DUT 74 can be determined. The arrays 62 and 64 can be activated accordingly to identify the component. As illustrated, illuminated light sources 80 and 82 identify component 78 out of components 76-79 of the DUT 74.

In an embodiment, the test area 68 can be configured to receive the DUT 74 in a particular position. For example, various alignment structures such as notches, holes, openings, or the like on the DUT 74 can match with similar structures in the test area 68 to substantially align the DUT 74 into a known position. In another embodiment, the position of the DUT 74 can be sensed. For example, the location and orientation can be sensed by a camera. The controller 66 can be configured to access information related to the placement of components on the DUT 74. The relative position of the arrays 62 and 64 to the test area 68, and hence the DUT 74, and the information related to the placement of components on the DUT 74 can be used to determine what light sources on the arrays 62 and 64 to activate to identify the components.

Figure 6:
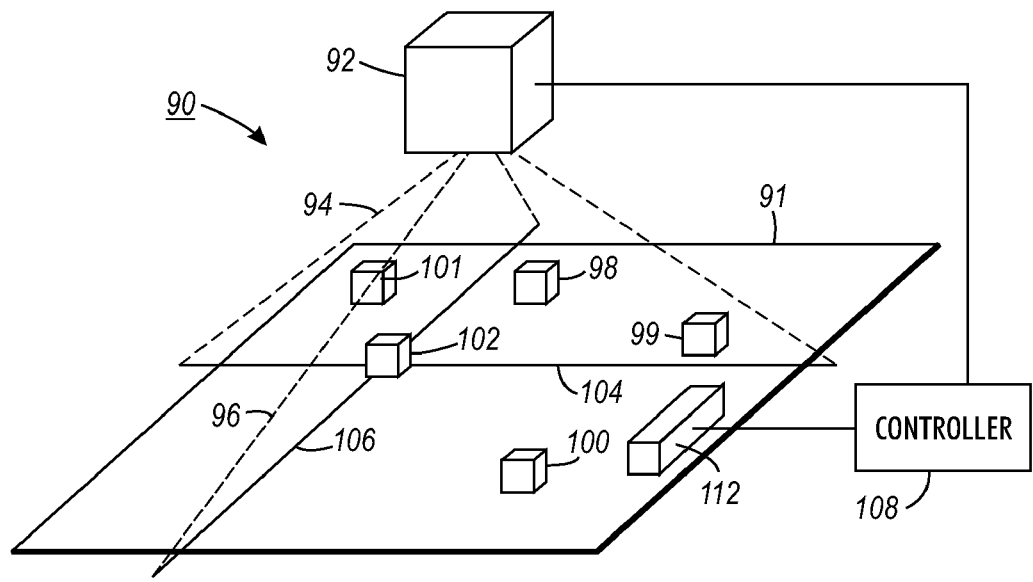
FIG. 6 is a block diagram of a test station with an optical component identifier according to another embodiment.

FIG. 6 is a block diagram of a test station with an optical component identifier according to another embodiment. In an embodiment, the test station can include a directional light source. The directionality of the light source can be used to identify components of a DUT 91 in the test station 90. A directional light source can include lasers, focused light sources, patterned light sources, or the like. For example, line lasers can be directional light sources. A focused incandescent light can be a directional light source. An omni-directional light source that is masked by a pattern can be a directional light source. Regardless of how obtained, the directional light can be used to illuminate components of the DUT 91.

For example, line lasers will be used as an example with respect to FIG. 6. In particular, the light source 92 is configured to emit beams 94 and 96 which, when impacting the DUT 91, create lines 104 and 106, respectively. As illustrated, lines 104 and 106 on the DUT 91 intersect at component 102, thus identifying component 102 from among components 98-102.

Similar to the test station described above, the DUT 91 can be coupled to a controller 108, for example, through connector 112 of the DUT 91. The controller 108 can be coupled to the light source 92. Accordingly, the controller 108 can be configured to adjust the directional light source such that the directional light illuminates the component of interest.

Although line lasers have been described above, directional light sources can be used in other techniques. For example, a directional light source can be used to create a pattern on the DUT 91. For example, the laser can draw a circle on the DUT 91 around the component of interest.

Figure 7:
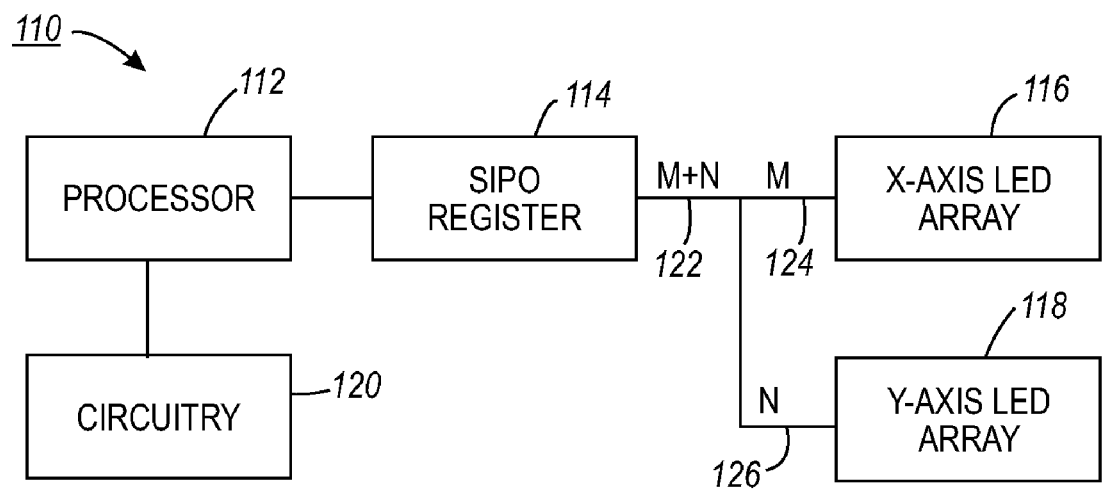
FIG. 7 is a block diagram of a circuit for an optical component identifier.

FIG. 7 is a block diagram of a circuit for an optical component identifier. The circuit 110 includes a processor 112, a serial in parallel out (SIPO) register 114, an X-axis LED array 116, and a Y-axis LED array 118. For example, the X-axis LED array 116 can correspond to array 18 of FIG. 1 and the Y-axis LED array 118 can correspond to array 16 of FIG. 1. The circuit 110 can include other circuitry 120. Such other circuitry 120 and the other parts of the circuit 110 can be identified by activating the X-axis LED array 116, and a Y-axis LED array 118. In an embodiment, the circuitry 120 can operate in conjunction with the processor 112. For example, the processor 112 can be a processor configured to control some functions on a circuit board including the processor 112 and the circuitry 120. Thus, in addition to controlling the activation of the LED arrays 116 and 118, the processor 112 can also control the circuitry 120. However, the processor 112 need not have any interaction with the circuitry 120. For example, another processor, controller, or the like (not illustrated) within the circuitry 120 can be configured to handle various functions for the circuitry. Such a processor can be coupled to the processor 112 for control of the LED arrays 116 and 118 as described above. In another embodiment, the processor 112 and the circuitry 120 need not have any functional relationship. For example, the processor 112 can be coupled to the same power supply, but other components, such as inputs, outputs, communication interfaces, or the like can be independent. Any degree of interoperability, commonality, or the like can be present on a circuit board.

In this embodiment the X-axis LED array 116, and a Y-axis LED array 118 are responsive to the SIPO register 114. The SIPO register 114 is configured to receive a serial input from the processor 112. The SIPO register 114 is configured to shift the serial input into the register to output a parallel M+N wide signal 122. The parallel M+N wide signal 12 can be split into a parallel M wide signal 124 and a parallel N wide signal 126.

Although a composite parallel M+N wide signal 122 has been described as output from the SIPO register 114, the SIPO register 114 can include multiple SIPO registers. For example, one SIPO register can be configured to receive a serial input from the processor 112 and to drive the X-axis LED array 116. A second SIPO register can be configured to receive a second serial input from the processor 112 and to drive the Y-axis LED array 118.

Although a SIPO register has been described, other types of registers can be used. For example, a parallel in parallel out register can be used. In another embodiment, an output of the processor 112, such as a data bus, can be used to drive the LED arrays 116 and 118.

Although LED arrays have been described in the context of the circuit 110, the circuit can include other light sources as described above.

Although particular embodiments have been described, it will be appreciated that the principles of the invention are not limited to those embodiments. Variations and modifications may be made without departing from the principles of the invention as set forth in the following claims.

What is claimed is:

1. A test station, comprising:
a light source;
a test area to receive a device under test (DUT); and
a controller coupled to the light source and configured to activate the light source to identify at least one part of the DUT based upon information about the DUT and a location of the portion to be identified.

2. The test station of claim 1, wherein:
the light source comprises a plurality of axes, each axis including a plurality of light sources; and
the axes are disposed on a perimeter of the test area.

3. The test state of claim 2, wherein:
the axes include a first axis and a second axis; and
the first axis and the second axis are substantially orthogonal.

4. The test station of claim 1, wherein the light source comprises a directional light source.

5. A method, comprising:
 determining a component of interest on a circuit board;
 accessing information about a location of the component of interest on the circuit board; and
 activating at least one light source to identify the component of interest.

6. The method of claim 5, further comprising:
 activating a plurality of light sources on a plurality of axes such that the activated light source identifies the component of interest.

7. The method of claim 6, the component of interest referred to as a first component of interest, the method further comprising:
 activating a first set of the light sources according to a first pattern to identify the first component of interest; and
 activating a second set of the light source according to a second pattern to identify a second component of interest;
 wherein the first pattern is different from the second pattern.

8. The method of claim 5, further comprising:
 emitting light from the at least one light source; and
 adjusting the at least one light source such that the light emitted from the at least one light source illuminates the component of interest.

9. The method of claim 5, further comprising:
 performing an onboard test on a circuit board including the light sources;
 wherein determining the component of interest includes determining the component of interest in response to the onboard test.

10. The method of claim 5, further comprising:
 performing a test procedure on a device under test (DUT);
 wherein activating the at least one light source includes activating the at least one light source to identify the component of interest in response to the test procedure.

11. The method of claim 10, further comprising:
 instructing an operator to probe a connection on the DUT;
 wherein the connection is the component of interest.

12. The method of claim 5, further comprising activating a first light source disposed along a first axis corresponding to a position of the component of interest along the first axis.

13. The method of claim 12, further comprising activating a second light source disposed along a second axis substantially orthogonal to the first axis corresponding to a position of the component of interest along the second axis.

* * * * *